United States Patent [19]

Hasegawa

[11] 4,312,020
[45] Jan. 19, 1982

[54] FREQUENCY RESPONSE ADJUSTING DEVICE FOR MAGNETIC SOUND RECORDER

[75] Inventor: Tsunao Hasegawa, Tokorozawa, Japan

[73] Assignee: Pioneer Electronic Corporation, Tokyo, Japan

[21] Appl. No.: 58,326

[22] Filed: Jul. 17, 1979

[30] Foreign Application Priority Data

Jul. 18, 1978 [JP] Japan ............................ 53-87918
Dec. 12, 1978 [JP] Japan ...................... 53-171790[U]

[51] Int. Cl.³ .................. G11B 5/45; G11B 5/02; G11B 27/36
[52] U.S. Cl. ........................ 360/65; 360/25; 360/27; 360/31
[58] Field of Search ................. 360/25, 27, 31, 65

[56] References Cited

U.S. PATENT DOCUMENTS

| | | |
|---|---|---|
| 2,791,640 | 5/1957 | Wolfe ........................ 360/31 |
| 3,659,060 | 4/1972 | Wolff ........................ 360/31 |
| 3,892,921 | 7/1975 | Burkowitz .................. 360/31 |
| 4,011,585 | 3/1977 | Sunaga ....................... 360/25 |
| 4,038,692 | 7/1977 | Umeda et al. ............... 360/28 |

Primary Examiner—Vincent P. Canney
Attorney, Agent, or Firm—Michael J. Striker

[57] ABSTRACT

A device for adjusting the frequency response characteristic of a magnetic sound recorder at relatively low and high frequencies, wherein the signal level of the recording signal to be supplied to the recording head of the recorder and the amount of compensation for the frequency response characteristic of the recording signal are adjusted by visual observation of a visible signal produced by one of electrically actuated light-emissive semiconductor elements which are to be selectively energized depending upon the relationship between the signal level of the playback signal and a reference signal which may be one of a plurality of predetermined reference signals or may be variable with the level of the recording signal.

11 Claims, 8 Drawing Figures

FREQUENCY RESPONSE ADJUSTING DEVICE FOR MAGNETIC SOUND RECORDER

FIELD OF THE INVENTION

The present invention relates in general to magnetic sound recorders and, particularly, to a device for adjusting the frequency response characteristic in a magnetic sound recorder. More particularly, the present invention relates to a device for regulating the recording signal level and the amount of compensation for the frequency response in a magnetic-tape sound recorder.

BACKGROUND OF THE INVENTION

Various types of magnetic tapes are presently in use for magnetic-tape sound recording. Magnetic-tape sound recorders are, thus, usually designed to operate with a proper frequency response characteristic depending upon the types of the tapes to be used on the recorders. Since, however, the frequency response characteristic of a magnetic-tape sound recorder varies from one tape to another even when the tapes may be of the same type or make, it is desired to adjust the frequency response characteristic of the recorder for each of the tapes to be used on the recorder to achieve sophisticated input-output characteristics in the recorder. For this purpose, it has been proposed and put into practice to provide a magnetic-tape sound recorder with a recording signal level meter adapted to indicate the signal level detected in the recording line of the recorder for enabling the operator of the recorder to visually determine the detected level of the recording signal. The level meter provided in an existing magnetic-tape sound recorder is used in combination with manually-operated signal level control means for adjusting the recording signal level of the recorder in such a manner that signals of a preselected level are supplied to the recording head of the recorder when the level meter registers the signal level of zero volume unit (vu) in response to input signals of a relatively low, predetermined frequency of for example 400 hertz. In another type of magnetic-tape sound recorder having a recording signal level meter, the level meter is used in combination with manually-operated frequency response compensating means for adjusting the amount of compensation for the frequency response of the recorder on the basis of an input signal of a relatively high predetermined frequency of for example 10 kilo hertz. The adjustments of the recording signal level and the amount of compensation for the frequency response characteristic in these known magnetic-tape sound recorders are, thus, manually conducted by having recourse to reading the level meters. Not only elaborate and skilled techniques but time-consuming efforts are therefore indispensable for the adjustment of the frequency response characteristics of known magnetic-tape sound recorders. The present invention contemplates provision of a simple and economical device which will enable the operator of a magnetic-tape sound recorder to easily and accurately adjust the frequency response characteristic of the recorder depending upon the individual types and makes of the magnetic tapes to be used on the recorder.

SUMMARY OF THE INVENTION

In accordance with the present invention, there is provided a device for adjusting the frequency response characteristic of a magnetic sound recorder, comprising two signal supply means for producing respective electric output signals having different frequencies, switching means shiftable between the two signal supply means, signal modifier means operative to modify each of the above mentioned output signals selectively passed through the switching means, recording means for producing on a magnetic recording medium a magnetic signal corresponding to the electric signal delivered from the signal modifier means, playback means for producing an electric signal corresponding to the magnetic signal produced on the recording medium, d.c. voltage generating means operative to produce a d.c. voltage variable with the signal level of the electric signal produced by the playback means, comparing means electrically connected to the d.c. voltage generating means and operative to compare the d.c. voltage with a reference voltage for producing different output signals depending upon the relationship between the d.c. voltage and the reference voltage, and display means responsive to an output signal from the comparing means for producing a visible signal indicative of the aforesaid relationship between the d.c. voltage and the reference voltage.

DESCRIPTION OF THE DRAWINGS

The features and advantages of the device according to the present invention will be appreciated more clearly from the following description taken in conjunction with the accompanying drawings in which.

DESCRIPTION OF THE PREFERRED EMBODIMENTS

Figure 1:
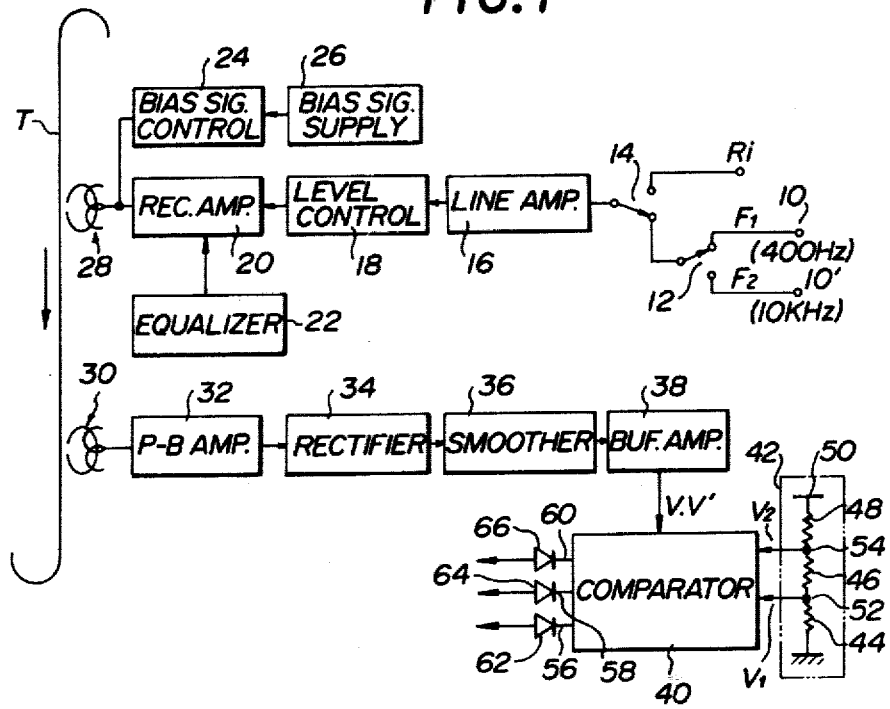
FIG. 1 is a block diagram showing the general circuit arrangement of a preferred embodiment of the device according to the present invention.
Figure 4:
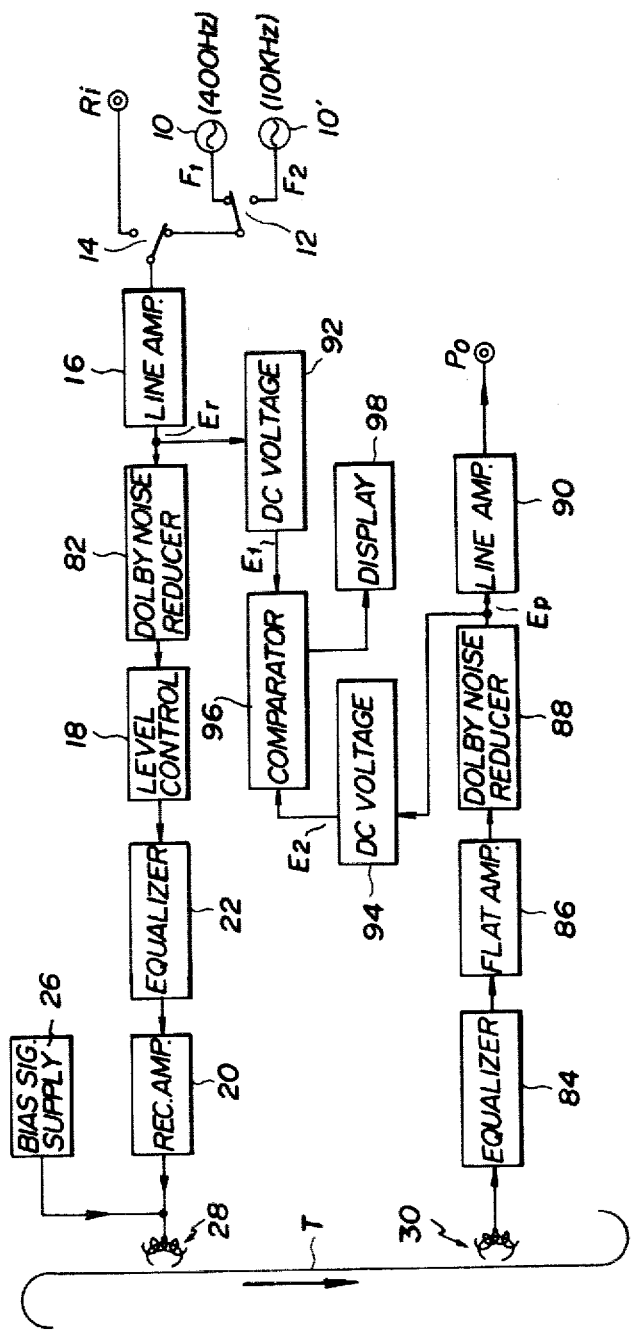
FIG. 4 is a block diagram showing the general circuit arrangement of another preferred embodiment of the device according to the present invention.

In the description to follow, it will be assumed by way of example that the present invention is embodied in a magnetic sound recorder of the type which uses as a recording medium a magnetic tape which is represented by T in the drawings, particularly in each of FIGS. 1 and 4. It will be, however, apparent that the subject matter of the present invention is applicable to not only a magnetic-tape sound recorder but magnetic sound recorders using other types of electro-magnetically activated recording media such as magnetic metal wires.

Referring to the drawings, first particularly to FIG. 1, a device embodying the present invention comprises first and second signal supply means which are constituted by first and second frequency generators 10 and 10' adapted to produce output signals F and F', respectively, having different frequencies. The frequency of the signal F to be delivered from the first frequency generator 10 is selected from a relatively low range of the frequency band ordinarily used in a magnetic-tape sound recorder and is herein assumed to be predetermined at 400 hertz by way of example. On the other hand, the frequency of the signal F' to be delivered from the second frequency generator 10' is selected from a relatively high range of the frequency band and is assumed also by way of example to be predetermined at 10 kilo-hertz.

The first and second frequency generators 10 and 10' thus arranged are electrically connected in parallel to the series combination of first and second two-position switches 12 and 14. The first switch 12 is shiftable between two input terminals or contacts respectively connected to the first and second frequency generators 10 and 10', while the second switch 14 is shiftable between an input terminal or contact connected to the output terminal of the first switch 12 and an input terminal or contact connected to the recording-line input terminal Ri of the magnetic-tape sound recorder pre se. On the recording-line input terminal Ri of the magnetic-tape sound recorder is to be impressed signals representative of the sound information to be recorded on a magnetic tape T when the magnetic-tape sound recorder is in a recording mode of operation.

The output terminal of the second switch 14 thus arranged is electrically connected across a recording-line amplifier 16 to the input terminal of a recording signal level control circuit 18 including a manually-operated variable resistor (not shown). The recording signal level control circuit 18 is adapted to continuously vary the signal level of the signal passed through the first and second switches 12 and 14 or the second switch 14 alone and amplified by the line amplifier 16. The level control circuit 18 has an output terminal connected to one input terminal of a recording amplifier 20. The recording amplifier 20 has another input terminal connected to an adjustable recording-signal equalizer control circuit 22 adapted to adjust the amount of compensation for the recording frequency characteristic at relatively high frequency levels including the frequency (10 kilo-hertz) of the signal F' to be delivered from the above described second frequency generator 10'. The adjustable recording-signal equalizer control circuit of the nature described above is well known in the art and may be connected between the recording signal level control circuit 18 and the recording amplifier 20.

In parallel with the recording amplifier 20 is electrically connected a bias signal control circuit 24 having an input terminal connected to a suitable source 26 of a d.c. or a.c. bias signal. The recording amplifier 20 and the bias signal control circuit 24 have respective output terminals jointly connected to electro-magnetic recording means such as, for example, the recording head 28 of the magnetic-tape sound recorder. The output signal from the recording amplifier 20 has superposed thereon the controlled bias signal delivered from the bias signal control circuit 24 and the resultant signal is impressed on electro-magnetic recording means such as, for example, the recording head 28 of the magnetic-tape sound recorder. The electric signal thus fed to the recording head 28 is recorded as a corresponding magnetic signal on the magnetic tape T which is being driven to travel in contact with the recording head 28.

The magnetic signal on the magnetic tape T is, in turn, converted into a corresponding electric signal by electro-magnetic playback means constituted by, for example, the playback head 30 of the magnetic-tape sound recorder. As is customary in an ordinary magnetic-tape sound recorder, the playback head 30 is electrically connected across a playback amplifier 32 to the playback-line output terminal (not shown) of the sound recorder so as to reproduce the sound information represented by the signals impressed on the recording-line input terminal Ri.

In the embodiment of the present invention, the playback head 30 of the magnetic-tape sound recorder is further electrically connected across the playback amplifier 32 to suitable d.c. voltage generating means such as a rectifier circuit 34 adapted to produce a d.c. voltage which is variable with the signal level of the playback signal delivered from the playback amplifier 32. The rectifier circuit 34 has an output terminal connected across a series combination of a smoother circuit 36 and a buffer amplifier 38 to a three-input comparator circuit 40 which constitutes comparing means in the embodiment of the present invention. The comparator circuit 40 has a playback signal input terminal connected to the output terminal of the above mentioned buffer amplifier 38, and first and second reference signal input terminals connected to a suitable reference signal supply circuit 42 adapted to produce two predetermined first and second reference voltages $V_1$ and $V_2$. In the arrangement herein shown, the reference signal supply circuit 42 is shown consituted by a series combination of three resistors which consist of first, second and third resistors 44, 46 and 48 connected between a positive bus 50 and ground. The first reference signal input terminal of the comparator circuit 40 is connected to a junction 52 between the first and second resistors 44 and 46 of the reference signal supply circuit 42 and the second reference signal input terminal of the comparator circuit 40 is connected to a junction 54 between the second and third resistors 46 and 48 of the reference signal supply circuit 42, as schematically shown in FIG. 1. The first, second and third resistors 44, 46 and 48 of the reference signal supply circuit 42 thus arranged are selected to produce the predetermined reference voltages $V_1$ and $V_2$ at these junctions 52 and 54, respectively, between the resistors 44, 46 and 48. The comparator circuit 40 further has three output terminals which consist of first, second and third output terminals 56, 58 and 60 and is internally constructed and arranged in such a manner as to selectively produce output signals $S_1$, $S_2$ and $S_3$ on these input terminals 56, 58 and 60, respectively, depending upon the relationship of the variable input voltage to the predetermined reference voltages $V_1$ and $V_2$. When the variable input voltage is lower than the first reference voltage $V_1$ which is lower than the second reference voltage $V_2$, the comparator 40 produces the output $S_1$ at the first output terminal 56 thereof. When the variable input voltage is higher than the first reference voltage $V_1$ and lower than the second reference voltage $V_2$, then the comparator circuit 40 delivers the output signal $S_2$ at the second output terminal 58 thereof. When the variable input voltage is higher than the second reference voltage $V_2$, the comparator circuit 40 produces the output signal $S_3$ at the third output terminal 60 thereof. The output terminals 56, 58 and 60 of the comparator circuit 40 thus operative are connected to the cathode terminals of first, second and third light-emissive diodes 62, 64 and 66, respectively, which constitute display means in the embodiment of the present invention.

Figure 2:
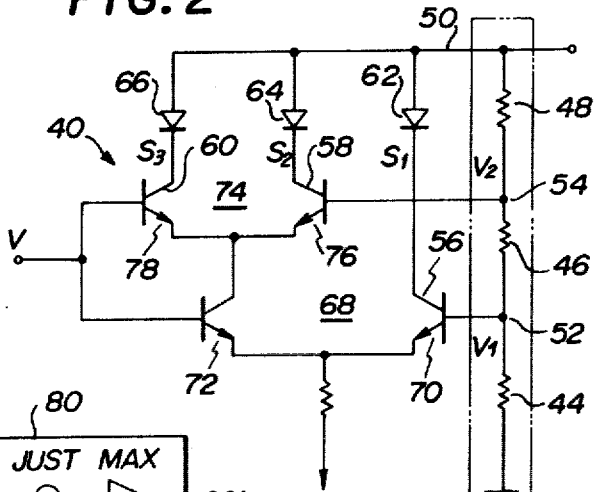
FIG. 2 is a view showing an example of the electric circuit network constituting the comparing means forming part of the circuit arrangement illustrated in FIG. 1.

Turning to FIG. 2 of the drawings, the comparator circuit 40 of the above described general nature is shown constituted by a window-type comparator comprising a first differential amplifier 68 composed of a pair of emitter-coupled transistors 70 and 72, and a second differential amplifier 74 composed of a pair of emitter-grounded transistors 76 and 78. The base electrode of one transistor 70 of the first differential amplifier 68 is connected to the junction 52 between the first and second resistors 44 and 46 of the reference signal supply circuit 42 and the base electrode of one transistor 76 of the second differential amplifier 74 is connected to the junction 54 between the second and third resistors 46 and 48 of the reference signal supply circuit 42. The respective base electrodes of the other transistors 72 and 78 are connected in parallel to the previously mentioned playback signal input terminal of the comparator circuit 40. The collector electrodes of the transistors 70, 76 and 78 constitute the above mentioned first, second and third output terminal 56, 58 and 60. respectively, of the comparator circuit 40 and are connected to the cathode terminals of the first, second and third light-emissive diodes 62, 64 and 66, respectively, which have their respective anode terminals jointly connected to the positive bus 50. The collector electrode of the transistor 72 is connected to a junction between the transistors 76 and 78 of the second differential amplifier 74.

When the variable input voltage appearing at the playback signal input terminal of the comparator circuit 40, viz., at the respective base electrodes of the transistors 72 and 78 of the first and second differential amplifiers 68 and 74 is lower than the predetermined reference voltage $V_1$ between the first and second resistors 44 and 46 of the reference signal supply circuit 42, viz., the voltage appearing at the base electrode of the transistor 70, the transistor 70 is conductive and the transistor 72 and accordingly the transistors 76 and 78 are non-conductive. Thus, only the first light-emissive diode 62 is energized from the positive bus 50 through the collector electrode 56 of the transistor 70, indicating that the variable input voltage of the comparator circuit 40 is lower than the first reference voltage $V_1$. If, on the other hand, the variable input voltage appearing at the respective base electrodes of the trassistors 72 and 78 is higher than the reference voltage $V_1$ between the first and second resistors 44 and 46 and is lower than the reference voltage $V_2$ between the second and third resistors 46 and 48, then the transistors 70 and 72 of the first differential amplifier 68 are non-conductive and conductive, respectively, and the transistors 76 and 78 of the second differential amplifier 74 are conductive and non-conductive, respectively. Under these conditions, only the second light-emissive diode 64 is energized from the positive bus 50 by way of the collector electrode 58 of the transistor 76, indicating that the variable input voltage of the comparator circuit 40 is higher than the first reference voltage $V_1$ and lower than the second reference voltage $V_2$. If, furthermore, the voltage appearing at the base electrode of each of the transistors 72 and 78 is higher than the voltage $V_2$, the transistors 70 and 72 of the first differential amplifier 68 are non-conductive and conductive, respectively, and the transistors 76 and 78 of the second differential amplifier 74 are non-conductive and conductive, respectively. As a consequence, only the third diode 66 is energized from the positive bus 50 through the collector electrode 60 of the transistor 78, indicating that the variable input voltage of the comparator circuit 40 is higher than the second reference voltage $V_2$.

Figure 3:
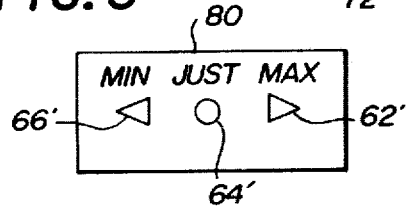
FIG. 3 is a plan view showing an example of the practical arrangement of the display means also forming part of the embodiment illustrated in FIG. 1.

The light-emissive diodes 62, 64 and 66 are incorporated in a control panel (not shown) of a magnetic-tape sound recorder and are arranged to be convenient for visual obervation of the light to be emitted from each of them. For this purpose, the diodes 62, 64 and 66 may be positioned behind an apertured plate 80 formed with three apertures 62', 64' and 66' which are shaped and arranged suitably as illustrated in FIG. 3. The light-emissive diodes 62, 64 and 66 are located adjacent these apertures 62', 64' and 66', respectively, so that the light emitted from each of the diodes can be viewed distinctly through the particular aperture allocated to the diode. The apertures 62', 64' and 66' may be marked with indications "MAX", "JUST" and "MIN", respectively, indicating that the signal level which is in play in the recording line of the magnetic-tape sound recorder in operation should be increased toward the maximum level, is proper or nearly proper, or should be reduced toward the minimum level.

The frequency response adjusting device constructed and arranged as has been described hereinbefore can be used for two different purposes, one of which is to adjust the recording signal level at the frequency level of 400 hertz and the other of which is to adjust the amount of compensation for the recording frequency response of the magnetic-tape sound recorder at the frequency level of 10 kilo-hertz. For the adjustment of the recording signal level at the relatively low frequency level, the first switch 12 is shifted to the input terminal or contact connected to the first frequency generator 10 and the second switch 14 is shifted to the input terminal or contact connected to the output terminal of the first switch 12 as illustrated in FIG. 1. A signal F having the frequency of 400 hertz is supplied to the input terminal of the recording-line amplifier 16 through the first and second switches 12 and 14. The frequency signal F thus amplified by the recording-line amplifier 16 is fed through the recording signal level control circuit 18 and the recording amplifier 20 to the recording head 28 of the magnetic-tape sound recorder and is recorded as a corresponding magnetic signal on the magnetic tape T being driven to travel past the recording head 28 and thereafter the playback head 30. The magnetic signal produced on the magnetic tape T is converted into a corresponding electric signal by means of the playback head 30 immediately after the magnetic signal is produced on the tape T. The a.c. signal thus delivered from the playback head 30 is fed upon amplification by the playback amplifier 32 to the rectifier circuit 34 and is thereby converted into a d.c. voltage which is variable with the level of the input signal impressed on the rectifier circuit 34. The d.c. voltage produced by the rectifier circuit 34 is supplied through the smoother circuit 36 and the buffer amplifier 38 to the playback signal input terminal of the comparator circuit 40 as a d.c. input voltage V. The comparator circuit 40 compares the input voltage V with the first and second reference voltages $V_1$ and $V_2$ supplied from the reference signal supply circuit 42 and delivers the output signal $S_1$, $S_2$ or $S_3$ on the first, second or third output terminal 56, 58 or 60, resepctively, of the comparator circuit 40 in the arrangement shown in FIG. 1 or the collector electrode of the transistor 70, 76 or 78, respectively, of the comparator circuit 40 shown in FIG. 2 depending upon the relationship between the input voltage V and the two reference $V_1$ and $V_2$, as previously described in detail. If, in this instance, the second light-emissive diode 64 is observed to be glowing through the central aperture 64' in the apertured plate 80 on the control panel of the magnetic-tape sound recorder, it is determined that the recording signal level established in the sound recorder by means of the recording signal level control circuit 18 is "just" or within an acceptable range. If however, either the first light-emissive diode 62 or the third emissive diode 66 is observed to be glowing through the righthand aperture 62' or the lefthand aperture 66', respectively, in the apertured plate 80, it must be that the signal level established in the recording line of the sound recorder by means of the recording signal level control circuit 18 is lower or higher, respectively, than the acceptable range. In this instance, the recording signal level can be increased or decreased to the acceptable range by manipulating the control knob (not shown) connected to the manually-operated variable resistor included in the level control circuit 18 until the second light-emissive diode 62 is observed to glow. The resistors 44, 46 and 48 constituting the reference voltage supply circuit 42 are, thus, selected so that the first and second reference voltages $V_1$ and $V_2$ to be produced therebetween correspond to the lower and upper limits, respectively, of the above mentioned acceptable range of the recording signal level.

When it is desired to adjust the amount of compensation for the frequency response charactertic of the magnetic-tape sound recorder, the first switch 12 in the arrangement of FIG. 1 is shifted to the input terminal or contact connected to the second frequency generator 10' with the second switch 14 connected to the first switch 12. A signal F' having the frequency of 10 kilohertz is now supplied through the first and second switches 12 and 14 to the input terminal of the recording-line amplifier 16. The frequency signal F' amplified by the recording-line amplifier 16 is fed through the recording signal level control circuit 18 and the recording amplifier 20 to the recording head 28 and is recorded as a corresponding magnetic signal on the magnetic tape T. The magnetic signal thus recorded on the tape T is immediately converted into a corresponding electric signal by the playback head 30 and is fed through the playback amplifier 32 to the rectifier circuit 32. A d.c. voltage corresponding to the output signal delivered from the playback amplifier 32 is produced by the rectifier circuit 34 and is supplied through the smoother circuit 36 and the buffer amplifier 38 to the playback signal input terminal of the comparator circuit 40 as an input voltage V'. The comparator circuit 40 compares the input voltage V' with the first and second reference voltages $V_1$ and $V_2$ and delivers the output signal $S_1$, $S_2$ or $S_3$ on the first, second or third output terminal 56, 58 or 60, respectively, of the comparator circuit 40 in the arrangement shown in FIG. 1 or the collector electrode of the transistor 70, 76 or 78, respectively, in the comparator circuit 40 shown in FIG. 2 depending upon the relationship between the input voltage V' and the reference voltages $V_1$ and $V_2$. If, in this instance, the second light-emissive diode 64 is observed to be glowing through the aperture 64' in the apertured panel 80, it is determined that the amount of compensation for the frequency response characteristic established in the sound recorder by means of the recording-signal equalizer circuit 22 is within an acceptable range between the values respectively corresponding to the reference voltages $V_1$ and $V_2$. If, however, either the first light-emissive diode 62 or the third light-emissive diode 66 is observed to be glowing through the aperture 62' or the aperture 66', respectively, it must be that the amount of compensation for the frequency response characteristic established by the recording-signal equalizer circuit 22 is lower or higher, respectively, than the acceptable range of the amount of compensation. In this instance, the amount of compensation for the recording frequency response can be increased or descreased to the acceptable range by manipulating the knob (not shown) connected to an actuating element for the equalizer circuit 22 until the second light-emissive diode 62 is observed to glow.

FIG. 4 shows a modification of the embodiment hereinbefore described with reference to FIGS. 1 to 3. In the modified embodiment illustrated in FIG. 4, a Dolby noise reduction circuit 82 is connected between the recording-line amplifier 16 and the recording signal level control circuit 18 and, furthermore, the recording signal equalizer circuit 22 is connected between the level control circuit 18 and the recording amplifier 20. The Dolby noise reduction system is, per se, well known in the art of magnetic-tape sound recorders and will not be described herein in respect of the construction and the principle of operation thereof. In the arrangement illustrated in FIG. 4, the playback amplifier 32 provided in the embodiment of FIG. 1 is substituted by a series combination of a playback-signal equalizer circuit 84 and a flat-output amplifier 86. The flat-output amplifier 88 is connected across a Dolby noise reduction circuit 88 and a playback-line amplifier 90 to the playback output terminal Po of the magnetic-tape sound recorder.

In the embodiment illustrated in FIG. 4, there are further provided first and second d.c. voltage generators 92 and 94 between the recording and playback lines of the magnetic-tape sound recorder. The first d.c. voltage generator 92 has an input terminal connected to the output terminal of the recording-line amplifier 16 and is operative to produce a d.c. output voltage $E_1$ which is variable with the signal level (denoted as Er) of the recording signal to be delivered from the recording-line amplifier 16. On the other hand, the second d.c. voltage generator 94 has an input terminal connected to the output terminal of the Dolby noise reduction circuit 88 in the playback line and is operative to produce a d.c. output voltage $E_2$ which is variable with the signal level (denoted as Ep) of the playback signal appearing at the input terminal of the playback-line amplifier 90. The first and second d.c. voltage generators 92 and 94 thus arranged have respective output terminals connected to a two-input comparator circuit 96 which is adapted to compare the d.c. output voltages $E_1$ and $E_2$ from the first and second d.c. voltage generators 92 and 94 with each other and produce an output signal $C_1$ when the voltage $E_1$ is higher than the voltage $E_2$ and an output signal $C_2$ when the voltage $E_1$ is lower than the voltage $E_2$. The output signal $C_1$ or $C_2$ produced by the comparator circuit 96 is supplied to a display circuit 98 which is responsive to the signal $C_1$ or $C_2$ for producing a visual signal indicating that the voltage $E_1$ is higher or lower, respectively, than the voltage $E_2$.

Figure 5:
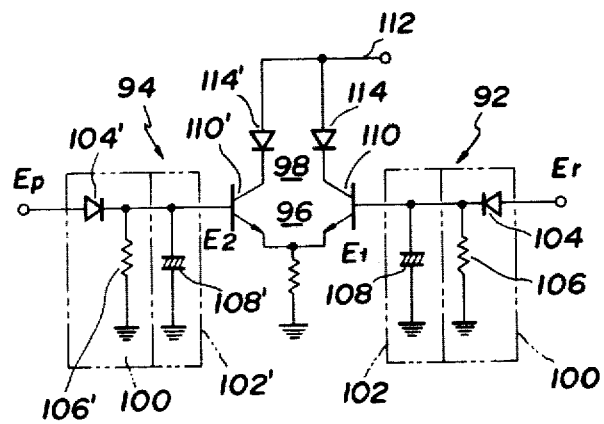
FIG. 5 is a view showing an example of the electric circuit network constituting the two d.c. voltage generating means and the comparing means included in the circuit arrangement illustrated in FIG. 4.

FIG. 5 shows examples of the detailed constructions and arrangements of the first and second d.c. voltage generators 92 and 94 and the comparator and display circuits 96 and 98 in the embodiment illustrated in FIG. 4.

In the circuit arrangement shown in FIG. 5, the first d.c. voltage generator 92 comprises a series combination of a rectifier circuit 100 and a smoother circuit 102 and, likewise, the second d.c. voltage generator 94 comprises a series combination of a rectifier circuit 100' and a smoother circuit 102'. The rectifier circuit 100 of the first d.c. voltage generator 92 is composed, by way of example, of a parallel combination of a diode 104 and a suitable resistor 106 and, similarly, the second d.c. voltage generator 94 composed of a parallel combination of a diode 104' and a resistor 106'. The diode 104 has its anode terminal connected to the output terminal of the recording-line amplifier 16 in the arrangement of FIG. 1, while the diode 104' has its anode terminal connected to the output terminal of the Dolby noise reduction circuit 88 in the playback line of the arrangement illustrated in FIG. 1. The smoother circuits 102 and 102' of the first and second d.c. voltage generators 92 and 94 are constituted, by way of example, by capacitors 108 and 108', respectively, each having one electrode connected to ground. Each of these smoother capacitors 108 and 108' is adapted to obliterate the ripples contained in the d.c. voltage delivered from each of the rectifier circuits 100 and 100'.

Figure 6:
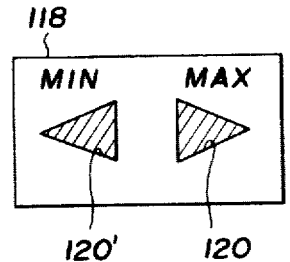
FIG. 6 is a plan view showing an example of the practical arrangement of the display means also included in the embodiment illustrated in FIG. 4.

In FIG. 5, furthermore, the comparator circuit 96 is shown to consist of a differential amplifier composed of first and second emitter-grounded transistors 110 and 110' having their respective base electrodes connected to the smoother circuits 102 and 102' of the first and second d.c. voltage generators 92 and 94, respectively. The respective collector electrodes of the transistors 110 and 110' are connected in parallel to a positive bus 112 across first and second light-emissive diodes 114 and 114', respectively, which constitute in combination the display circuit 98 schematically shown in FIG. 1. The respective emitter electrodes of the transistors 110 and 110' are grounded through a suitable resistor 116 as shown. The light-emissive diodes 114 and 114' are incorporated in a control panel (not shown) of the magnetic-tape sound recorder and are arranged so that the light to be emitted from each of the diodes 114 and 114' is readily accessible to visual observation from the outside of the control panel. For this purpose, the light-emissive diodes 114 and 114' may be positioned behind an apertured plate 118 formed with two apertures 120 and 120' which are shaped and arranged suitably as illustrated in FIG. 6. The first and second light-emissive diodes 114 and 114' are located adjacent these apertures 120 and 120', respectively, so that the light emitted from each of the diodes can be viewed distinctly through the particular aperture allocated to the diode. The apertured plate 118 may be marked with indications "MAX" and "MIN" indicating the apertures 120 and 120' for the first and second light-emissive diodes 114 and 114', respectively.

When, now, the first and second switches 12 and 14 of the device illustrating in FIG. 4 are in the positions providing connection between the first frequency generator 10 and the recording-line amplifier 16, a signal F having the frequency of 400 hertz is supplied to the recording-line amplifier 16 through the switches 12 and 14. The frequency signal F is, upon amplification by the recording-line amplifier 16, fed through the Dolby noise reduction circuit 82, recording signal level control circuit 18, equalizer circuit 22 and recording amplifier 20 to the recording head 28 of the magnetic-tape sound recorder and is recorded as a corresponding magnetic signal on the magnetic tape T being driven to travel past the recording head 28 and thereafter the playback head 30. The magnetic signal thus produced on the magnetic tape T is, immediately thereafter, converted by means of the playback head 30 into a corresponding electric signal, which is fed by way of the equalizer circuit 84, flat-output amplifier 86 and Dolby noise reduction circuit 88 and further upon amplification by the playback amplifier 90 to the playback-line output terminal Po of the magnetic-tape sound recorder.

Figure 7:
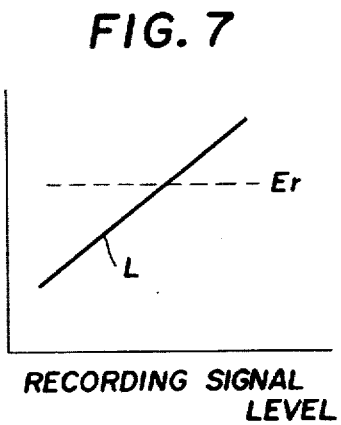
FIG. 7 is a graph showing the principle of operation on which the device illustrated in FIG. 4 is to be operated for the adjustment of the recording signal level of a magnetic-tape sound recorder at a predetermined, relatively low recording frequency.

The recording signal appearing at the output terminal of the recording-line amplifier 16 is supplied not only to the Dolby noise reduction circuit 82 in the recording line but to the first d.c. voltage generator 92. Likewise, the playback signal appearing at the output terminal of the Dolby noise reduction circuit 88 in the playback line is fed not only to the playback-line amplifier 90 but to the second d.c. voltage generator 94. In response to the recording signal thus applied to the first d.c. voltage generator 92, the rectifier circuit 100 forming part of the d.c. voltage generator 92 shown in FIG. 5 produces on the base electrode of the first transistor 110 of the comparator circuit 96 a d.c. output voltage $E_1$ which is representative of the signal level Er of the recording signal. Similarly, the rectifier circuit 100' forming part of the d.c. voltage generator 94 shown in FIG. 5 produces on the base electrode of the second transistor 110' of the comparator circuit 96 a d.c. output voltage $E_2$ which is representative of the signal level Ep of the playback signal supplied to the second d.c. voltage generator 94. If, under these conditions, the d.c. voltage $E_1$ appearing at the base electrode of the first transistor 110 is higher than the d.c. voltage $E_2$ appearing at the base electrode of the transistor 110', the first transistor 110 is rendered conductive and the second transistor 110' stays in the non-conductive state. In this instance, only the first light-emissive diode 114 of the display circuit 98 is energized from the positive bus 112 through the collector electrode of the first transistor 110 and is thus observed to be glowing through the righthand aperture 120 in the apertured plate 118. The first light-emissive diode 114 being observed to be glowing, it is determined that the signal level Er of the recording signal at the frequency of 400 hertz is higher than the signal level Ep of the playback signal established in response to the particular level of the recording signal. If, conversely, the d.c. voltage $E_1$ appearing at the base electrode of the transistor 110 is lower than the d.c. voltage $E_2$ appearing at the base electrode of the transistor 110', the first transistor 110 is held in non-conductive state and the second transistor 110' is rendered conductive. In this instance, only the second light-emissive diode 114' of the display circuit 98 is energized from the positive bus 112 and is observed to be glowing through the lefthand aperture 120' in the apertured plate 118. The second light-emissive diode 114' being thus observed to be glowing, it is determined that the signal level Er of the recording signal at the frequency of 400 hertz is lower than the signal level Ep of the playback signal established in response to the particular recording signal level. When it is determined that the signal level Er is higher than the signal level Ep, the control knob (not shown) for the manually-operated variable resistor included in the recording signal level control circuit 18 is manually turned in a direction to increase the level of the output signal from the level control circuit 18 so as to increase the signal to be produced in response to the output signal from the level control circuit 18 as will be seen from plot L shown in the graph of FIG. 7. If, conversely, the signal level Er of the recording signal is found to be lower than the signal level Ep of the playback signal, the control knob for the recording signal level control circuit 18 is turned in the reverse direction to reduce the level of the output signal from the level control circuit 18 and accordingly the level Ep of the playback signal. The signal level of the recording signal at the frequency of 400 hertz can be adjusted in these manners by manipulating the control knob for the recording signal level control circuit 18 until the first and second light-emissive diodes 114 and 114' are observed to glow alternately when the control knob is minutely turned alternately in the opposite directions.

Figure 8:
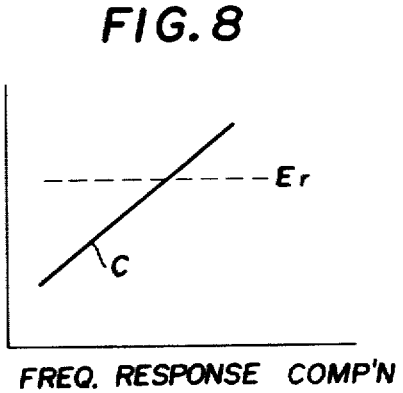
FIG. 8 is a graph similar to FIG. 7 but shows the principle of operation on which the device of FIG. 4 is to be operated for the adjustment of the frequency characteristic of a magnetic-tape sound recorder at a predetermined, relatively high recording frequency.

When, on the other hand, the first and second switches 12 and 14 in the device illustrated in FIG. 1 are in the positions providing electric connection between the second frequency generator 10' and the recording-line amplifier 16, a signal F' having the frequency of 10 kilo-hertz is supplied to the recording-line amplifier 16. In this instance, either the first light-emissive diode 114 or the second light-emissive diode 114' of the display circuit 98 will be observed to glow through the aperture 120 or the aperture 120', respectively, in the apertured plate 118 (FIG. 6) on the control panel of the magnetic-tape sound recorder if the amount of compensation for the frequency response characteristic established by the recording-signal equalizer circuit 22 at the frequency level of 10 kilo-hertz is excessive or insufficient. When this occurs, the amount of compensation for the frequency response characteristic can be adjusted properly by manipulating the control knob for the recording-signal equalizer circuit 22 until the first and second light-emissive diodes 114 and 114' are observed to glow alternately when the control knob is minutely turned alternately in the opposite directions. The signal level Ep of the playback signal varies with the signal level of the output signal from the recording-signal equalizer circuit 22, viz., the amount of compensation for the frequency response characteristic to be regulated by the equalizer circuit 22, as will be understood from plot C in the graph of FIG. 8.

Now, it is assumed that the signal level Ep of the playback signal appearing in the playback line of the embodiment illustrated in FIG. 4 is of the value Eo when a magnetic tape is used for the recording and playback at 0 (zero) volume unit (vu). The recording signal level control circuit 18 is adjusted so that the signal level Ep of the playback signal assumes the value Eo when the signal level Ep of the recording signal is of the value Eo. Under these conditions, the recording signal level Ep is equal to the playback signal level Ep irrespective of the frequency of the signal supplied to the recording line of the magnetic-tape sound recorder unless the magnetic tape is not magnetically saturated or insofar as the sound recorder is exhibiting a substantially "flat" or constant frequency response characteristic.

If the same magnetic-tape sound recorder is used for the recording and playback with another magnetic tape providing a frequency response which is 2 decibels higher than that provided by the first magnetic tape, then the level of the signal to be recorded on the tape and accordingly the level Ep of the playback signal will also be higher by 2 decibels than those achieved by the use of the first tape at low to medium frequencies. In this instance, the recording signal level control circuit 18 should be adjusted so that the signal level Ep of the playback signal is reduced by 2 decibels at low to medium frequencies. After the adjustment of the level of the signal to be recorded at low to medium frequencies is made in this fashion, a signal having a higher frequency and a signal level which will not magnetically saturate the magnetic tape in use is supplied to the recording-signal equalizer circuit 22 and adjustment is made on the equalizer circuit 22 in such a manner that the signal level of the resultant playback signal becomes equal to the signal level of the recording signal. The embodiment illustrated in FIG. 4 is, thus, adapted to provide a substantially "flat" or constant frequency response characteristic practically throughout the operating range of the input frequencies by the above described two steps.

What is claimed is:

1. A device for adjusting the frequency response characteristic of a magnetic sound recorder, comprising two signal supply means for producing respective electric output signals having different frequencies; switching means shiftable between said two signal supply means; signal modifier means operative to modify each of said output signals selectively passed through said switching means; electromagnetic recording means for producing on a magnetic recording medium a magnetic signal corresponding to the electric signal delivered from said signal modifier means; electromagnetic playback means for producing an electric signal corresponding to said magnetic signal; d.c. voltage generating means operative to produce a d.c. voltage variable with the signal level of the electric signal produced by said playback means; comparing means electrically connected to said d.c. voltage generating means and operative to compare said d.c. voltage with at least one reference voltage for producing a one of at least two different output signals when the d.c. voltage is lower than said at least one reference voltage and another of said at least two different output signals when the d.c. voltage is higher than the reference voltage; display means responsive to each of said at least two different output signals from said comparing means for producing a visible signal indicative of each of said at least two different output signals from the comparing means; and reference signal supply means for delivering to said comparing means a predetermined first reference voltage and a predetermined second reference voltage higher than said first reference voltage, said comparing means having first, second and third output terminals connected in parallel to said display means and being operative to produce a first output signal on the first output terminal thereof when said d.c. voltage is lower than said first reference voltage, a second output signal on the second output terminal thereof when said d.c. voltage is higher than said first reference voltage and lower than said second reference voltage, and a third output signal on the third output terminal thereof when said d.c. voltage is higher than said second reference voltage.

2. A device as set forth in claim 1, in which said signal modifier means consists of recording signal level control means operative to vary the signal level of the recording signal to be converted into said magnetic signal by said recording means.

3. A device as set forth in claim 2, in which said display means comprises electrically actuated first, second and third light-emissive elements respectively connected to said first, second and third output terminals of said comparing means.

4. A device as set forth in claim 3, in which said reference signal supply means has first and second output terminals for delivering said first and second reference signals respecti-ely therethrough and in which said comparing means comprises first and second differential amplifiers each including a pair of emitter-coupled transistors, one of the transistors of the first differential amplifier having its base electrode connected to the first output terminal of said reference signal supply means and its collector electrode connected to said first light-emissive element, the other transistor of the first differential amplifier having its base electrode connected to said d.c. voltage generating means and its collector electrode connected to the respective emitter electrodes of the transistors of said second differential amplifier, one of the transistors of the second differential amplifier having its base electrode connected to the second output terminal of said reference signal supply means and its collector electrode connected to said second light-emissive element, and the other transistor of said second differential amplifier having its base electrode connected to said d.c. voltage generating means and its collector electrode connected to said third light-emissive element.

5. A device as set forth in claims 3 or 4, in which said d.c. voltage generating means comprises a series combination of a rectifier circuit having an input terminal connected to said playback means and a smoother circuit having an input terminal connected to said rectifier circuit and an output terminal connected to said comparing means.

6. A device as set forth in claim 1, in which said signal modifier means consists of recording-signal compensating means operative to vary the amount of compensation for the frequency response characteristic of the recording signal to be converted into said magnetic signal by said recording means.

7. A device for adjusting the frequency response characteristic of a magnetic sound recorder, comprising two signal supply means for producing respective electric output signals having different frequencies; switching means shiftable between said two signal supply means; signal modifier means operative to modify each of said output signals selectively passed through said switching means; electromagnetic recording means for producing on a magnetic recording medium a magnetic signal corresponding to the electric signal delivered from said signal modifier means; electromagnetic playback means for producing an electric signal corresponding to said magnetic signal; d.c. voltage generating means operative to produce a d.c. voltage variable with the signal level of the electric signal produced by said playback means; comparing means electrically connected to said d.c. voltage generating means and operative to compare said d.c. voltage with at least one reference voltage for producing a one of at least two different out-put signals when the d.c. voltage is lower than said at least one reference voltage and another of said at least two different output signals when the d.c. voltage is higher than the reference voltage; and display means responsive to each of said at least two different output signals from said comparing means for producing a visible signal indicative of each of said at least two different output signals from the comparing means, said d.c. voltage generating means including a first d.c. voltage generator operative to produce a d.c. output signal variable with the signal level of the signal passed through said switching means and a second d.c. voltage generator operative to produce said d.c. voltage variable with the signal level of the electric signal produced by said playback means, said comparing means having two input terminals respectively connected to the first and second d.c. voltage generators and being operative to compare the respective output voltages from the first and second d.c. voltage generators with each other for producing a first output signal when the d.c. voltage from one of the first and second d.c. voltage generators is higher than the d.c. output signal from the other of the first and second d.c. voltage generators and a second output signal when the d.c. output signal from said one of the first and second d.c. voltage generators is lower than the d.c. output voltage from said other of the first and second d.c. voltage generators.

8. A device asset forth in claim 7, in which said comparing means further has first and second output terminals for delivering therethrough said first and second output signals, respectively, thereof and in which said display means comprises electrically actuated first and second light-emissive elements connected to said first and second output terminals, respectively, of said comparing means.

9. A device as set forth in claim 7, in which said comparing means comprises a differential amplifier including a pair of emitter-coupled transistors having their respective base electrodes connected to said first and second d.c. voltage generators, respectively, and their respective collector electrodes connected to said display means.

10. A device as set forth in claim 9, in which said display means comprises two electrically actuated light-emissive elements connected to the collector electrodes of said transistors, respectively.

11. A device as set forth in claim 10, in which each of said first and second d.c. voltage generators comprises a series combination of a rectifier circuit and a smoother circuit having an input terminal connected to the rectifier circuit, wherein the rectifier circuit of the first d.c. generator has an input terminal connected between said switching means and said signal modifier means and the rectifier circuit of the second d.c. voltage generator has an input terminal connected to said playback means and wherein each of the respective smoother circuits of the first and second d.c. voltage generators is connected to said comparing means.

* * * * *